United States Patent
Liles et al.

(10) Patent No.: US 9,548,089 B2
(45) Date of Patent: Jan. 17, 2017

(54) PIPELINING AN ASYNCHRONOUS MEMORY REUSING A SENSE AMP AND AN OUTPUT LATCH

(71) Applicant: QUALCOMM Incorporated, San Diego, CA (US)

(72) Inventors: Stephen Edward Liles, Apex, NC (US); Satendra Kumar Maurya, Raleigh, NC (US); Kunal Garg, Raleigh, NC (US); Chiaming Chai, Cary, NC (US); Chintan Shah, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/742,706

(22) Filed: Jun. 18, 2015

(65) Prior Publication Data

US 2016/0293234 A1 Oct. 6, 2016

Related U.S. Application Data

(60) Provisional application No. 62/141,830, filed on Apr. 1, 2015.

(51) Int. Cl.
*G11C 7/10* (2006.01)
*G11C 7/22* (2006.01)
*G11C 7/06* (2006.01)

(52) U.S. Cl.
CPC . *G11C 7/22* (2013.01); *G11C 7/06* (2013.01); *G11C 7/065* (2013.01); *G11C 7/106* (2013.01); *G11C 7/1039* (2013.01); *G11C 7/1066* (2013.01)

(58) Field of Classification Search
CPC .............. G11C 7/22; G11C 7/106; G11C 7/06
See application file for complete search history.

(56) References Cited

U.S. PATENT DOCUMENTS

| | | | |
|---|---|---|---|
| 5,204,560 A | 4/1993 | Bredin et al. | |
| 6,507,224 B1 | 1/2003 | Lee et al. | |
| 6,633,188 B1 | 10/2003 | Jia et al. | |
| 7,557,630 B2 | 7/2009 | Kim | |
| 7,692,466 B2 | 4/2010 | Ahmadi | |
| 8,553,482 B2 | 10/2013 | Chow | |
| 2004/0202014 A1* | 10/2004 | Palmer | G11C 11/419 365/154 |
| 2013/0064019 A1 | 3/2013 | Frederick, Jr. et al. | |
| 2014/0289440 A1 | 9/2014 | Shu | |

OTHER PUBLICATIONS

International Search Report and Written Opinion—PCT/US2016/024957—ISA/EPO—Jul. 11, 2016.

* cited by examiner

*Primary Examiner* — J. H. Hur
*Assistant Examiner* — Mohammed A Bashar
(74) *Attorney, Agent, or Firm* — Muncy, Geissler, Olds & Lowe, P.C.

(57) ABSTRACT

An asynchronous memory includes a memory array, a sense amplifier, an output latch, and a controller. In response to a clock signal from an external circuit requesting a read operation, the controller provides the clock signal to the memory array to read data, and controls the sense amplifier and the output latch to provide the functionality of a flip-flop master and slave so that the read operation delay through the output latch to the external circuit is removed from a first read cycle of two sequential read cycles.

19 Claims, 4 Drawing Sheets

PIPELINING AN ASYNCHRONOUS MEMORY REUSING A SENSE AMP AND AN OUTPUT LATCH

CROSS-REFERENCE TO RELATED APPLICATIONS

The present application claims the benefit of U.S. Provisional Patent Application No. 62/141,830 entitled "PIPELINING AN ASYNCHRONOUS MEMORY REUSING A SENSE AMP AND AN OUTPUT LATCH," filed Apr. 1, 2015, assigned to the assignee hereof, the contents of which are hereby expressly incorporated by reference in their entirety.

FIELD OF DISCLOSURE

Embodiments pertain to electronic circuits, and more particularly to asynchronous memory circuits.

BACKGROUND

When a circuit external to an asynchronous (self-timed) memory requests a read operation on the asynchronous memory, the asynchronous memory typically performs the read operation on the rising edge of a clock signal provided by the external circuit. A sense amplifier provides the retrieved data from the memory to an output latch. For high-performance, single-cycle memories, the retrieved data held by the output latch is then latched by flip-flops in the external circuit on a subsequent rising edge of the clock signal. It is desirable for this read path to fit within a cycle (or perhaps a little more if the subsequent rising edge of the clock signal is delayed) and is often a critical path in high-performance systems.

SUMMARY

Embodiments of the invention are directed to systems and methods for pipelining an asynchronous memory by re-using a sense amp and an output latch.

In an embodiment, a circuit comprises: a memory array to store data; a sense amplifier coupled to the memory array; an output latch coupled to the sense amplifier; and a controller to provide a clock signal to the memory array, an enable signal to the sense amplifier, and a latch signal to the output latch; wherein in a first cycle of the clock signal to perform a first read operation to read a first data stored in the memory array, the controller drives the clock signal to a first state to begin the first read operation and then drives the clock signal to a second state, the controller drives the enable signal from a second state to a first state so that the sense amplifier holds the first data, and the controller drives the latch signal from a first state to a second state before driving the enable signal to its first state; and wherein in a second cycle of the clock signal immediately following the first cycle of the clock signal, the controller drives the enable signal from its first state to its second state, and the controller drives the latch signal from its second state to its first state before the controller drives the enable signal to its second state so that the output latch latches the first data.

In an embodiment, a method to read a memory array comprises: reading a first data in a first clock cycle from the memory array; enabling a sense amplifier in the first clock cycle to hold the first data; disabling an output latch in the first clock cycle before enabling the sense amplifier in the first clock cycle; disabling in a second clock cycle, the second clock cycle immediately following the first clock cycle, the sense amplifier; and enabling the output latch in the second clock cycle to latch the first data before disabling in the second clock cycle the sense amplifier.

In an embodiment, a method to read a memory array comprises: means for reading a first data in a first clock cycle from the memory array; means for enabling a sense amplifier in the first clock cycle to hold the first data; means for disabling an output latch in the first clock cycle before enabling the sense amplifier in the first clock cycle; means for disabling in a second clock cycle, the second clock cycle immediately following the first clock cycle, the sense amplifier; and means for enabling the output latch in the second clock cycle to latch the first data before disabling in the second clock cycle the sense amplifier.

In an embodiment, a circuit comprises: a memory array to store data; a sense amplifier coupled to the memory array; an output latch coupled to the sense amplifier; and a controller, wherein in a first clock cycle to read a first data from the memory array, the controller enables the sense amplifier to hold the first data, where the controller disables the output latch before enabling the sense amplifier; and wherein in a second clock cycle immediately following the first clock cycle, the controller disables the sense amplifier but enables the output latch before disabling the sense amplifier so that the output latch latches the first data in the second clock cycle.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Embodiments are disclosed in the following description and related drawings. Alternate embodiments may be devised without departing from the scope of the claims. Additionally, well-known elements will not be described in detail or will be omitted so as not to obscure the relevant details of the embodiments.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
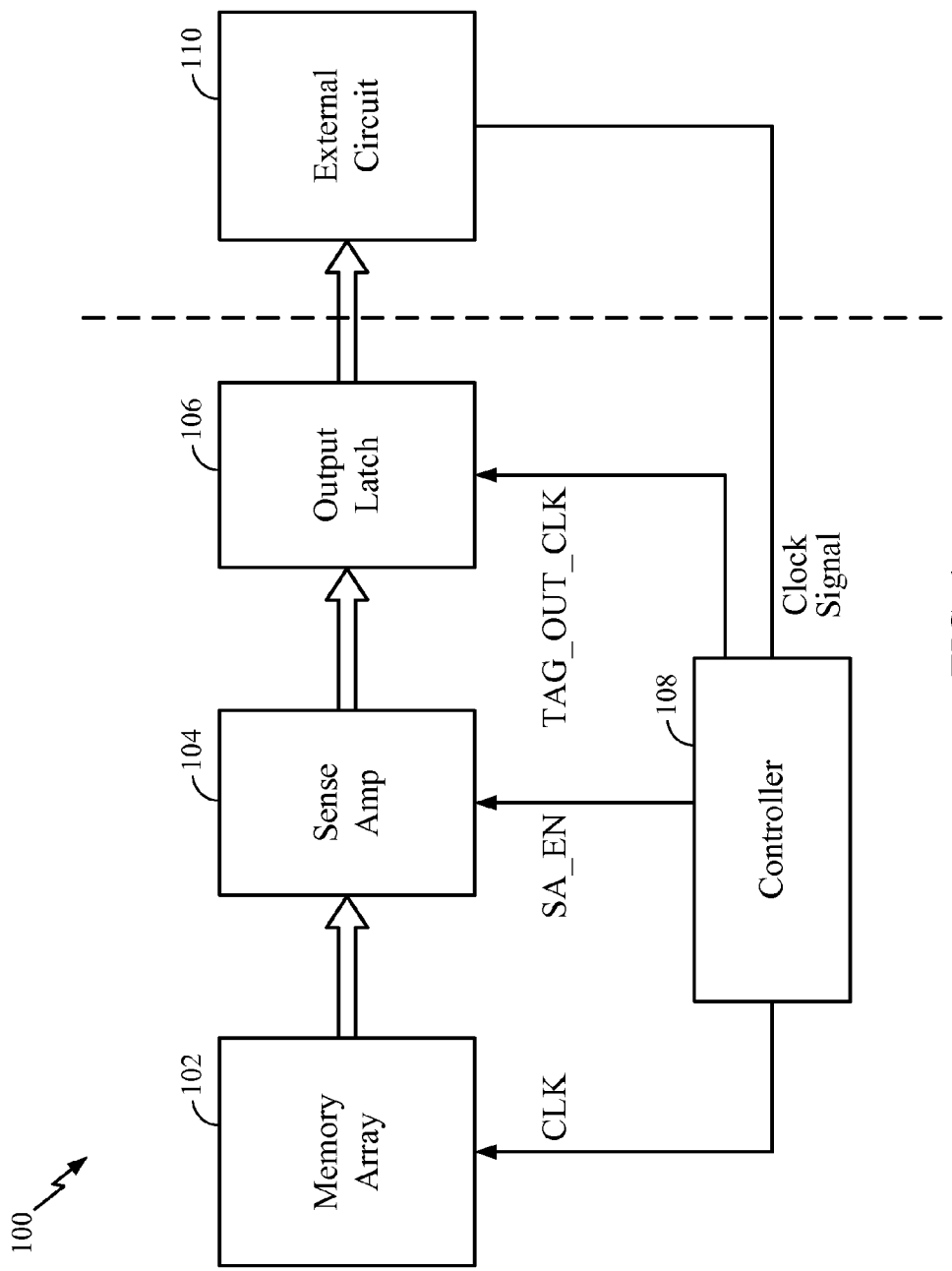
FIG. 1 illustrates an asynchronous memory system according to an embodiment.

FIG. 1 is a high-level schematic of a system in which an embodiment may find application. FIG. 1 illustrates the asynchronous memory 100 comprising the memory array 102 for storing data, the sense amplifier 104 for reading the data retrieved from the memory array 102 during a read operation, and the output latch 106 coupled to the sense amplifier 104 to latch data read from the memory array 102. The external circuit 110 requests a read operation to retrieve data stored in the memory array 102, and provides a clock signal to the controller 108, where the controller 108 provides various control signals to the memory array 102, the sense amplifier 104, and the output latch 106. The data latched by the output latch 106 is made available to the external circuit 110 that requested the read operation.

All components illustrated in FIG. 1 may be formed in one semiconductor die (chip), or the external circuit 110 may reside on a chip separate from a chip for the asynchronous memory 100. For example, the external circuit 110 may be fabricated on one chip in a multi-chip package, where the asynchronous memory 100 is fabricated on a second chip in the multi-chip package.

The term data may mean a state of a circuit indicative of information bits that the data refers to, or it may mean a signal or signals indicative of these information bits. The signal may be a voltage signal or a current signal. Accordingly, data is a term of art, and its meaning should be clear from context. For example, one may refer to the memory array 102 as storing data, the sense amplifier 104 as holding data retrieved from the memory array 102 in a read operation, or the output latch 106 as latching data provided by the sense amplifier 104. In some cases, the term data may refer to both a state and one or more signals. For example, regarding the example of referring to the output latch 106 as latching data, the output latch 106 may be considered as being in a state indicative of the information bits to which the data refers to, or the data may be considered various voltage signals in the latch 106 that are HIGH or LOW to indicate the information bits.

A signal representing a digital voltage may be referred to as HIGH or LOW, it being understood that in a digital circuit a HIGH represents a range of voltages that represent a first Boolean value, such as 1, and a LOW represents a range of voltages that represent a second Boolean value that is the logical complement of the first Boolean value, such as 0. A signal may also be referred to as having a state, where in one state the signal is HIGH and in another state the signal is LOW.

The controller 108 controls the sense amplifier 104 and the output latch 106 to provide the functionality of a flip-flop master and slave. Embodiments may provide advantages such as: a significant performance improvement, where the delay through the output latch 106 to the external circuit 110 is removed from a first read cycle of two sequential read cycles; the timing margin can be taken from a second read cycle of two sequential read cycles and given to the first read cycle, if needed; and by using the sense amplifier 104 and the output latch 106 to provide the functionality of a flip-flop with master and slave, there is a reduction in silicon area used for read operations.

The dashed line in FIG. 1 denotes the interface between the asynchronous memory 100 and the external circuit 110. The external circuit 110 requests a read operation on the asynchronous memory 100 by providing a clock signal to the controller 108. The controller 108 provides the clock signal received from the external circuit 110 to the memory array 102, where this signal is denoted as CLK. These two clock signals may be considered and referred to as two distinct clock signals because the clock signal provided by the controller 108 to the memory array 102 may be a delayed or modified version of the clock signal provided by the external circuit 110 to the controller 108. The controller 108 also provides an enable signal, denoted as SA_EN, to the sense amplifier 104, and provides another signal, denoted as TAG_OUT_CLK, to the output latch 106. The signals SA_EN and TAG_OUT_CLK may be derived from the clock signal provided by the external circuit 110 to the controller 108.

Figure 2:
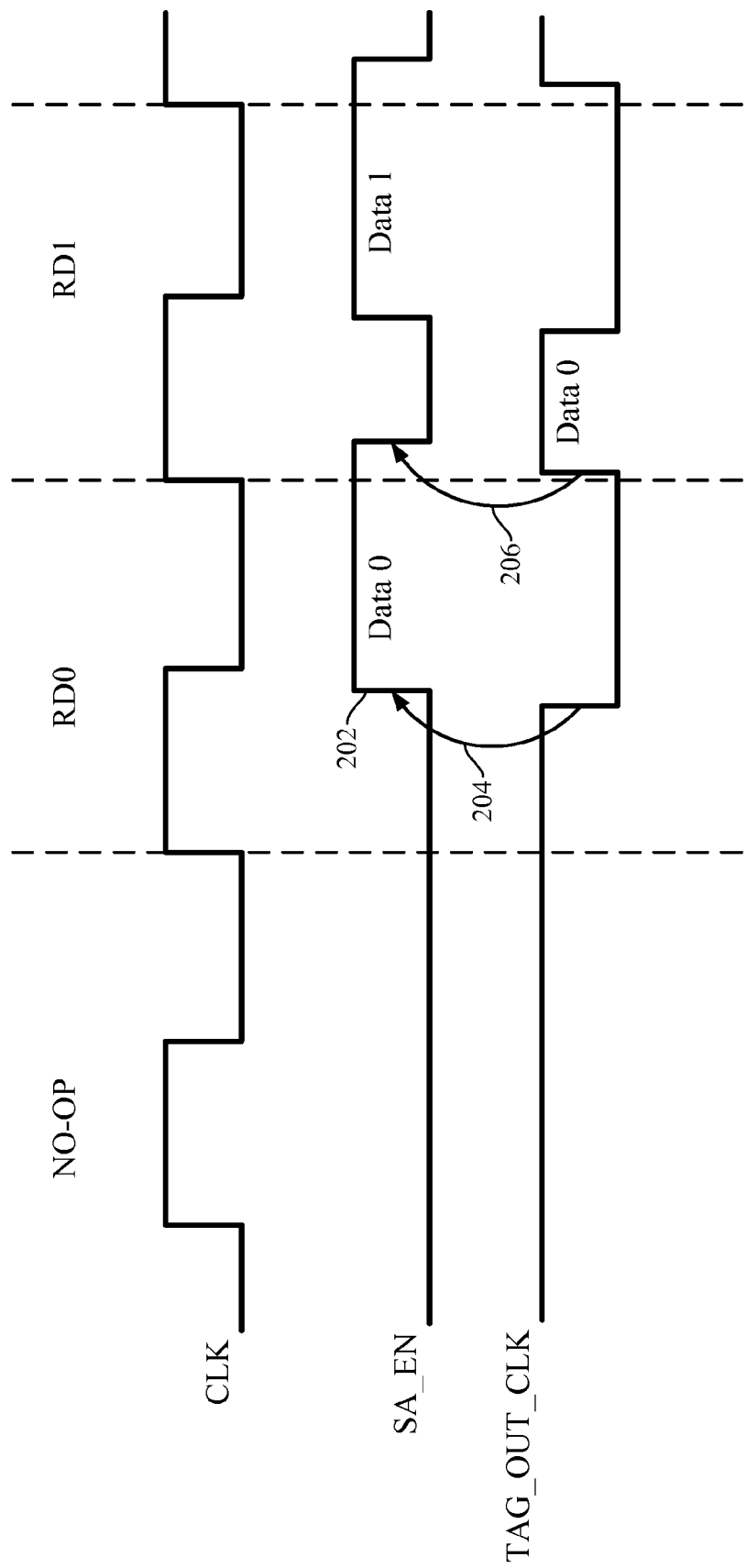
FIG. 2 illustrates a timing diagram for the system of FIG. 1.

The signals SA_EN and TAG_OUT_CLK are timed so that the combination of the sense amplifier 104 and the output latch 106 provides the functionality of a flip-flop with master and slave, where the sense amplifier 104 serves the role of the master and the output latch 106 serves the role of the slave. FIG. 2 is a timing diagram for the signals CLK, SA_EN, and TAG_OUT_CLK, illustrating three clock cycles comprising a non-operation, denoted as NO-OP, followed by two sequential read operations, denoted as RD0 and RD1.

A read operation begins with the rising edge of the CLK signal. Consider the first read operation RD0 in FIG. 1. The rising edge of the SA_EN signal in the first read operation RD0 is labeled 202. In the particular example illustrated in FIG. 2, the rising edge 202 occurs before the CLK signal transitions from HIGH to LOW. This is not a requirement, but the SA_EN signal should transition from LOW to HIGH before the end of the first read operation RD0 with sufficient margin so that the sense amplifier 104 has time to hold the data that is read from the memory array 102 in the first read operation.

The TAG_OUT_CLK signal should go LOW before the SA_EN signal goes HIGH. The arrow 204 denotes this first timing margin. The SA_EN signal is held HIGH into the next read operation RD1, but before the SA_EN signal goes LOW, the TAG_OUT_CLK signal should go HIGH to latch the data that was retrieved during the first read operation RD0. The arrow 206 denotes this second timing margin.

Accordingly, in the first read operation RD0, the data retrieved from the memory array 102, denoted as Data0 in FIG. 2, is held by the sense amplifier 104 when the SA_EN signal transitions HIGH, and is then latched by the output latch 106 as the TAG_OUT_CLK signal transitions HIGH before the SA_EN signal transitions LOW. As a result, the output latch 106 has available the data Data0 to provide to the external circuit 110 in the second read operation cycle, indicated as RD1 in FIG. 2. That is, the pipelining inherent in the asynchronous memory 100 and the timing diagram of FIG. 2 is such that the data requested by the external circuit 110 in a read operation is available on the next read operation cycle.

The process repeats, whereby the SA_EN signal goes LOW in the second read operation RD1 before the CLK signal goes LOW. The SA_EN signal is then driven HIGH during the read operation RD1 (with sufficient timing margin) to hold the data that is read in the second read operation RD1, indicated as Data1 in FIG. 2. The data Data1 will be latched by the output latch 106 in a third read operation cycle (or in a third clock cycle if no third read operation is performed) when the TAG_OUT_CLK signal goes HIGH before the SA_EN signal is driven LOW.

Figure 3:
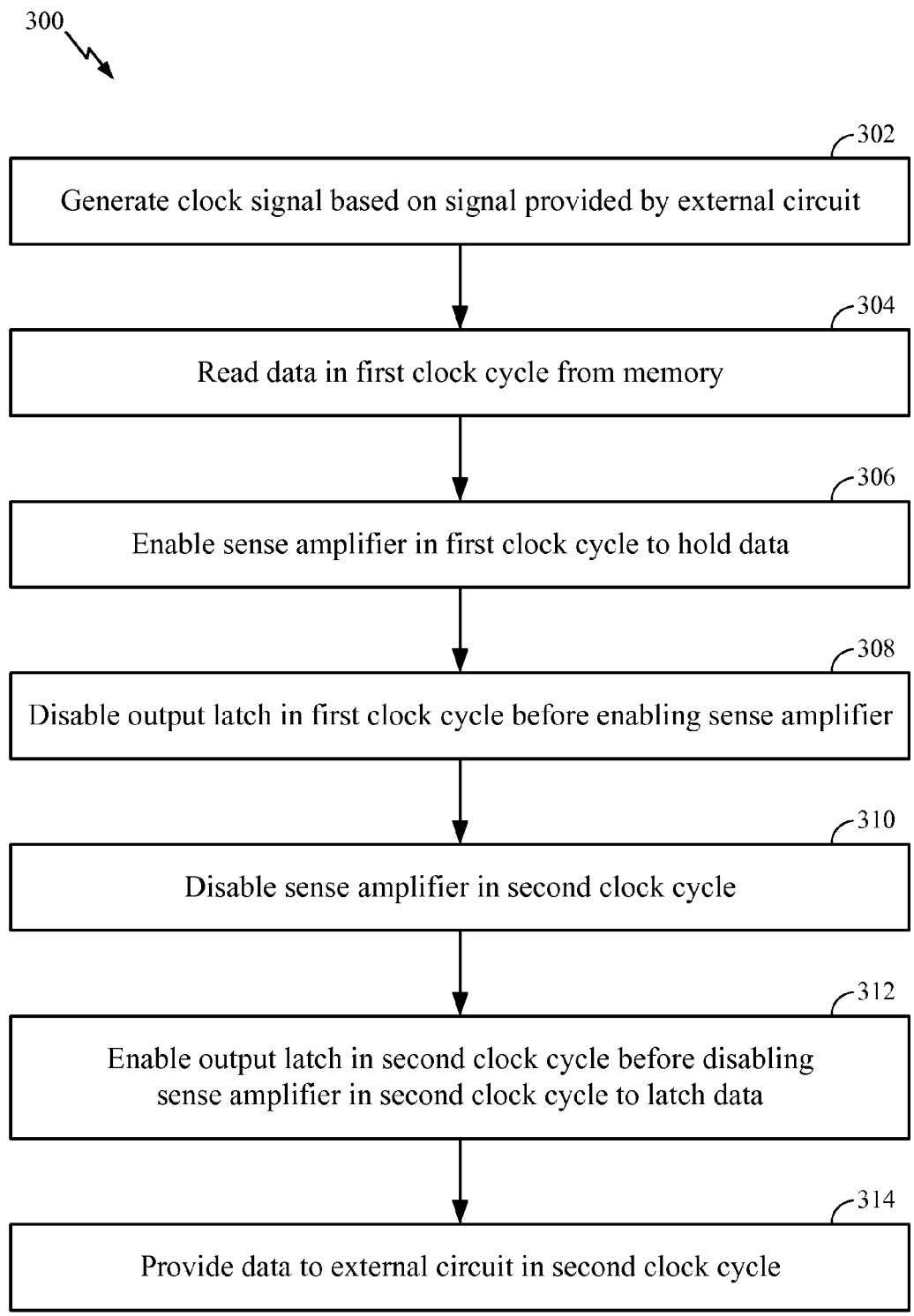
FIG. 3 illustrates a method according to an embodiment.

FIG. 3 illustrates a method according to an embodiment. In the action 302, the controller 108 generates the clock signal provided to the memory array 102 based upon a clock signal provided to it by the external circuit 110. In the action 304, data is read from the memory array 102 in a first clock cycle. In the action 306, the controller 108 enables the sense amplifier 104 in the first clock cycle to hold the data that was read from the memory array 102. This is indicated by the rising edge 202 in FIG. 2. In the action 308, the controller 108 disables the output latch 106 in the first clock cycle before enabling the sense amplifier 104. The arrow 204 in FIG. 2 illustrates this timing margin.

In the action 310, the controller 108 disables the sense amplifier 104 in a second clock cycle. It is to be understood that the second clock cycle immediately follows the first clock cycle. In the action 312, the controller 108 enables the output latch 106 in the second clock cycle to latch the data that was read from the memory array 102 in the first clock cycle. This event occurs before the controller 108 disables the sense amplifier 104 in the second clock cycle. The arrow 206 in FIG. 2 illustrates this timing margin. In the action 314, the data that was read from the memory array 102 in the first clock cycle is now available to the external circuit 110 in the second clock cycle.

The actions illustrated in FIG. 3 may be repeated over a plurality of clock cycles. For example, the action 304 may be repeated but where the recited action of reading data from the memory array 102 occurs in the second clock cycle. Similarly, the remaining actions indicated in FIG. 3 may be repeated except for occurring in succeeding clock cycles. The order of the blocks illustrated in FIG. 3 is not meant to imply a specific ordering among their respective actions. For example, the action 312 will occur before the action of 310 because the output latch 106 should be enabled in a clock cycle before disabling the sense amplifier in the same clock cycle.

Figure 4:
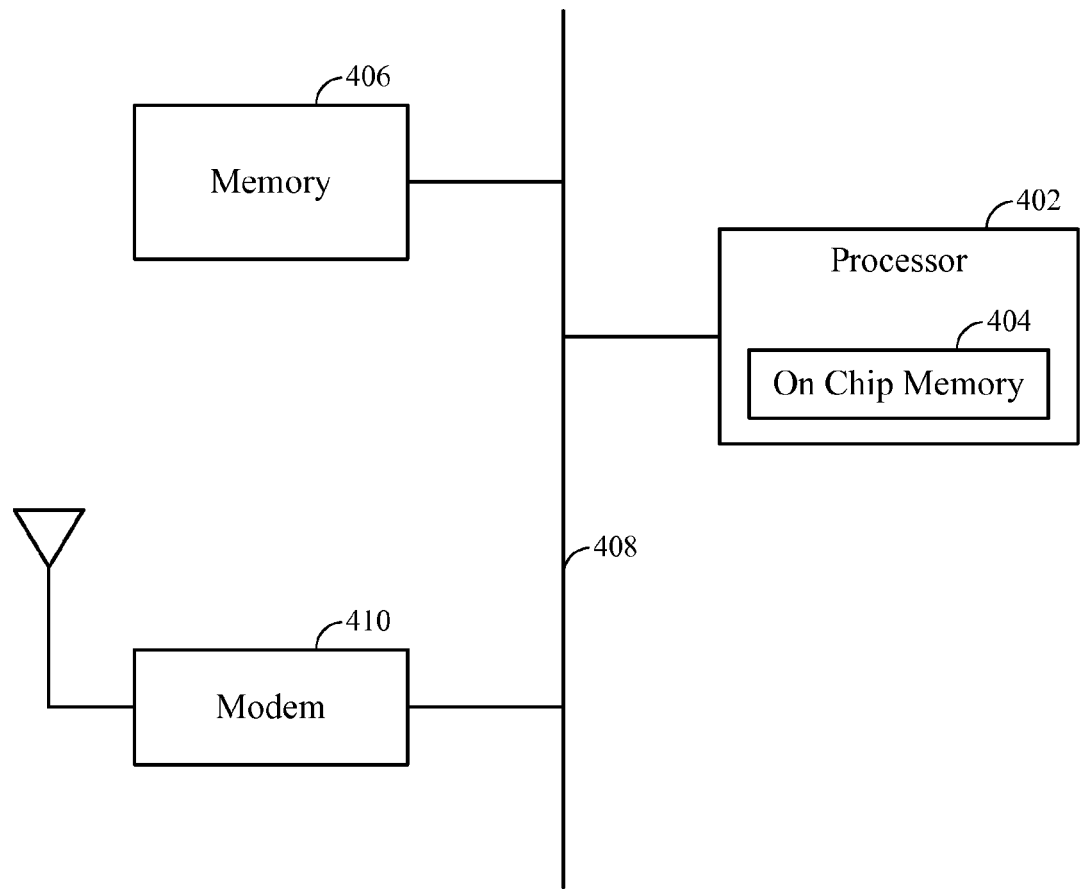
FIG. 4 is a high-level abstraction of a cellular phone in which an embodiment may find application.

Embodiments may find applications in a wide variety of electronic systems. For example, FIG. 4 illustrates at a high-level abstraction several components of a cellular phone: the processor 402 having the on-chip memory 404, the memory 406 coupled to the processor 402 by way of the bus 408, and the modem 410. Embodiments may find application where an asynchronous memory may be included in the on-chip memory 404, or in the memory 406, or both. The memory 406 may belong to a memory hierarchy. Various functional units within the processor 402 may serve as the external circuit 110. Multiple processor cores formed in one or more semiconductor dies may realize the processor 402. Clearly, embodiments may find application in other electronic systems, such as a system-on-chip.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for pipelining an asynchronous memory reusing a sense amp and an output latch. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A circuit comprising:
   a memory array configured to store data;
   a sense amplifier coupled to the memory array;
   an output latch coupled to the sense amplifier; and
   a controller configured to:
      provide a first clock signal to the memory array, an enable signal to the sense amplifier, and a latch signal to the output latch, the controller configured to generate the first clock signal based on a second clock signal received from an external circuit;
      perform a first read operation to read a first data stored in the memory array in a first clock cycle of the first clock signal;
      drive the first clock signal to a first state and then drive the first clock signal to a second state in the first clock cycle of the first clock signal, the first clock signal driven to the first state to begin the first read operation;
      drive the latch signal from a first state to a second state and then drive the enable signal from a second state to a first state in the first clock cycle of the first clock signal, the enable signal driven to the first state to cause the sense amplifier to hold the first data;
drive the latch signal from the second state to the first state and then drive the enable signal from the first state to the second state in a second clock cycle of the first clock signal, the second clock cycle of the first clock signal immediately following the first clock cycle of the first clock signal, wherein the latch signal is driven to the first state to cause the output latch to latch the first data; and
provide the first data to the external circuit in the second clock cycle of the first clock signal.

2. The circuit of claim 1, wherein
the first clock signal is HIGH when in the first state and is LOW when in the second state;
the enable signal is HIGH when in the first state and is LOW when in the second state; and
the latch signal is HIGH when in the first state and is LOW when in the second state.

3. The circuit of claim 1, wherein the controller is further configured to:
drive the first clock signal to the first state in the second clock cycle of the first clock signal to begin a second read operation to read a second data from the memory array; and
drive the latch signal from the first state to the second state and then drive the enable signal from the second state to the first state in the second clock cycle of the first clock signal, wherein the enable signal is driven from the second state to the first state to cause the sense amplifier to hold the second data.

4. The circuit of claim 3, wherein
the first clock signal is HIGH when in the first state and is LOW when in the second state;
the enable signal is HIGH when in the first state and is LOW when in the second state; and
the latch signal is HIGH when in the first state and is LOW when in the second state.

5. The circuit of claim 3, wherein the controller is further configured to drive the latch signal from the second state to the first state and then drive the enable signal from the first state to the second state in a third clock cycle of the first clock signal, wherein the third clock cycle of the first clock signal immediately follows the second clock cycle of the first clock signal, and wherein the latch signal is driven to the first state to cause the output latch to latch the second data.

6. The circuit of claim 5, wherein the controller is further configured to:
provide the second data to the external circuit in the third clock cycle of the first clock signal.

7. A method to read a memory array, comprising:
generating a first clock signal to provide at least a first clock cycle and a second clock cycle, wherein the first clock signal is generated based on a second clock signal received from an external circuit;
reading a first data from the memory array in the first clock cycle;
enabling a sense amplifier in the first clock cycle to hold the first data;
disabling an output latch in the first clock cycle before enabling the sense amplifier in the first clock cycle;
disabling the sense amplifier in the second clock cycle, the second clock cycle immediately following the first clock cycle;
enabling the output latch in the second clock cycle to latch the first data before disabling the sense amplifier in the second clock cycle; and
providing the first data to the external circuit in the second clock cycle.

8. The method of claim 7, further comprising:
reading a second data from the memory array in the second clock cycle;
enabling the sense amplifier in the second clock cycle to hold the second data; and
disabling the output latch in the second clock cycle before enabling the sense amplifier in the second clock cycle.

9. The method of claim 8, further comprising:
disabling the sense amplifier in a third clock cycle, the third clock cycle immediately following the second clock cycle; and
enabling the output latch in the third clock cycle to latch the second data before disabling the sense amplifier in the third clock cycle.

10. The method of claim 9, further comprising:
providing the second data to the external circuit in the third clock cycle.

11. An apparatus configured to read a memory array, the apparatus comprising:
means for generating a first clock signal to provide at least a first clock cycle and a second clock cycle, wherein the first clock signal is generated based on a second clock signal received from an external circuit;
means for reading from the memory array a first data in the first clock cycle;
means for enabling a sense amplifier in the first clock cycle to hold the first data;
means for disabling an output latch in the first clock cycle before enabling the sense amplifier in the first clock cycle;
means for disabling the sense amplifier in the second clock cycle, the second clock cycle immediately following the first clock cycle;
means for enabling the output latch in the second clock cycle to latch the first data before disabling the sense amplifier in the second clock cycle; and
means for providing the first data to the external circuit in the second clock cycle.

12. The apparatus of claim 11, further comprising:
means for reading from the memory array a second data in the second clock cycle;
means for enabling the sense amplifier in the second clock cycle to hold the second data; and
means for disabling the output latch in the second clock cycle before enabling the sense amplifier in the second clock cycle.

13. The apparatus of claim 12, further comprising:
means for disabling the sense amplifier in a third clock cycle, the third clock cycle immediately following the second clock cycle; and
means for enabling the output latch in the third clock cycle to latch the second data before disabling the sense amplifier in the third clock cycle.

14. The apparatus of claim 13, further comprising:
means for providing the second data to the external circuit in the third clock cycle.

15. A circuit comprising:
a memory array configured to store data;
a sense amplifier coupled to the memory array;
an output latch coupled to the sense amplifier; and
a controller configured to:

generate a first clock signal to provide at least a first clock cycle and a second clock cycle to immediately follow the first clock cycle, wherein the controller is configured to generate the first clock signal based on a second clock signal received from an external circuit;

read a first data from the memory array in the first clock cycle;

disable the output latch and subsequently enable the sense amplifier in the first clock cycle, the sense amplifier enabled in the first clock cycle to hold the first data;

enable the output latch and subsequently disable the sense amplifier in the second clock cycle the output latch enabled in the second clock cycle to latch the first data; and provide the first data to the external circuit in the second clock cycle.

16. The circuit of claim 15, wherein the controller is further configured to read a second data from the memory array in the second clock cycle and to disable the output latch and subsequently enable the sense amplifier in the second clock cycle, the sense amplifier enabled in the second clock cycle to hold the second data.

17. The circuit of claim 16, wherein the controller is further configured to enable the output latch and subsequently disable the sense amplifier in a third clock cycle, the third clock cycle immediately following the second clock cycle and wherein the controller is configured to enable the output latch in the third clock cycle to latch the second data.

18. The circuit of claim 17, wherein the controller is further configured to provide the second data to the external circuit in the third clock cycle.

19. The circuit of claim 15, further comprising:
a processor; and
on-chip memory in the processor, wherein the on-chip memory comprises the memory array, the sense amplifier, the output latch, and the controller.

* * * * *